March 19, 1968 N. J. GRIFFIN 3,374,442
BIAS CONTROL CIRCUIT
Filed Sept. 30, 1965
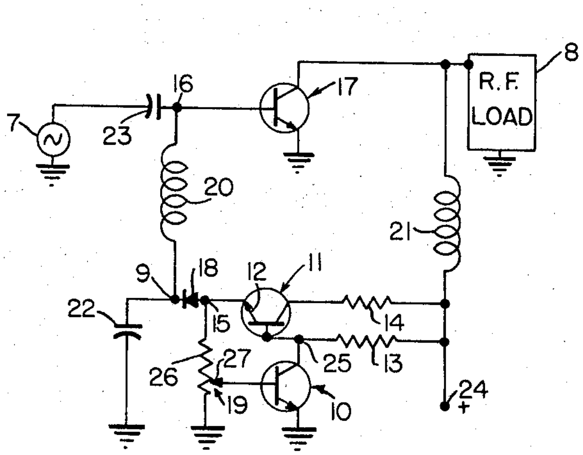
INVENTOR.
NOEL J. GRIFFIN
BY Alden D. Redfield
Charles M. Hogan
ATTORNEYS.

United States Patent Office 3,374,442
Patented Mar. 19, 1968

3,374,442
BIAS CONTROL CIRCUIT

Noel J. Griffin, Cincinnati, Ohio, assignor to Avco Corporation, Cincinnati, Ohio, a corporation of Delaware Filed Sept. 30, 1965, Ser. No. 491,651
2 Claims. (Cl. 330—40)

ABSTRACT OF THE DISCLOSURE

Linear operation of a common emitter transistorized radio frequency power amplifier is provided by this invention. An R.F. source is capacitively coupled to the base of the amplifier. The forward bias network for that base comprises a series combination of choke, diode and a resistor having a variable tap output. A constant voltage regulator device comprising a pair of transistors is coupled to this variable tap output and to the anode of the diode in such a manner as to provide a stable positive voltage at the reference point established by that anode. The apparent input D.C. resistance of the power transistor decreases as its collector current is increased by R.F. excitation. Changes in voltage across the diode are opposite to the changes across the input base-emitter junction of the power transistor and the constant voltage available at the reference point is distributed between the diode and this junction.

The present invention relates to biasing circuitry for transistors and it provides automatic means for the control of the operational bias on a transistorized radio frequency power amplifier, for the purpose of maintaining fully linear operation.

An object of the invention is to provide a workable solution to the dilemma presented by conflicting requirements discussed below.

For a better understanding of the invention, together with other and further objects and advantages thereof, reference is made to the following description of the single figure of the accompanying drawings, which figure is a schematic diagram of a transistorized radio frequency power amplifier including a biasing network in accordance with the invention.

Referring to that figure, there is shown a radio frequency signal source 7, coupled by a capacitor 23 to the base of a common-emitter arranged transistor 17 feeding into a conventional load 8. Isolation of the amplifier input from my novel biasing network, at radio frequencies, is provided by a choke 20 connected between points 16 and 9 (i.e., between the base of transistor 17 and the cathode of diode 18). The output of the amplifier transistor 17 is isolated from the energy source terminal 24, for radio frequencies, by a choke 21.

Operation of a power transistor at high power and high frequency as a linear amplifier imposes the requirement that the transistor be forward-biased into a linear region. That is, a transistor such as that designated 17 must be forward-biased. It is conventional practice to produce this forward bias by tapping current from a resistive divider network, in turn connected to a source of direct current potential.

Efficiency dictates that high-power transistor amplifiers productive of 5 to 30 watts of output or more be operated in the class B or AB mode, with bias levels on the order of 5 to 25 milliamperes. A direct current component flows in the base-emitter circuit of a power amplifier transistor when operated in a class B or AB mode. Therefore, consideration of low power consumption requires that the bias network be of high impedance, so that the power consumed thereby will be small compared to the output power of the amplifier—that is, 5% or less. On the other hand, the tendency for the bias level of such an amplifier to shift under operating conditions and to cause it to operate in a class C mode imposes a conflicting requirement of a bias network of lower impedance.

In accordance with the invention, a constant voltage regulator device is included in the biasing network for transistor 17. This network comprises a pair of transistors 10 and 11 (each type 2N697). Transistor 10 (type NPN) is arranged in the common-emitter configuration with its emitter connected to ground, its base connected to the movable contact of a potentiometer 19 (500 ohms), and its collector connected to one lead of a load resistor 13 (2200 ohms), the other lead of which is connected to the positive terminal 24 of a source of electrical energy (not shown). This single source provides reverse bias for the collector and forward bias for the base of transistor 10. The collector of transistor 10 is directly connected to the base of transistor 11 at point 25. The collector of transistor 11 (type NPN) is reverse-biased by connection to the point 24 through a collector current dissipating resistor 14 (270 ohms). The voltage at point 24 is +25 volts, D.C., for the implementation shown.

The positive bias on the base of transistor 11 is controlled by the collector circuit of transistor 10. The emitter 12 of transistor 11 is connected to terminal 15, the ungrounded terminal of the potentiometer 19, and this point is coupled, via portion 26 of potentiometer 19 and the movable contact 27, to the base of transistor 10, thus completing a feedback loop.

The transistors 10 and 11 and associated components provide a constant voltage regulator network which, independent of current dissipated in collector load 14, provides a stable positive voltage at point 15.

A variation in voltage at emitter 12 affects the drive on transistor 10 in a manner to restore the preset value. For example, if the voltage at emitter 12 is lowered, transistor 10 will tend to decrease in conduction, increasing the voltage at the base of transistor 11. This, in turn, makes transistor 11 conduct more heavily and returns the voltage at emitter 12 to normal.

Resistor 13 serves as the collector load for transistor 10, and resistor 14 as a dissipation limiter for transistor 11. With a constant voltage at emitter 12 this voltage will divide between points 15 and 16 and point 16 and ground. As the R.F. (radio frequency) signal is increased at point 16, the plus voltage potential at point 16 is decreased due to the rectified D.C. current component working into the high base-to-emitter circuit impedance of transistor 17. This negative voltage component, caused by the rectified base-to-emitter current, tends to move the amplifying stage of transistor 17 into a class C mode of operation. But reduction of the positive voltage at point 16 causes transistor 11 to conduct more heavily and raise the voltage at point 15 back to normal. This maintains point 16 at a net positive potential to ground, and the amplifying stage of transistor 17 in forward bias for linear mode operation.

The amplifying stage (transistor 17) apparent input D.C. resistance decreases as the collector current is increased, due to R.F. excitation. Diode 18 serves to shape the bias voltage as a function of the operational level of the amplifying stage. As the collector current of transistor 17 is increased, the input D.C. resistance decreases. With a fixed voltage at the anode of diode 18, the increase in current, caused by the decrease of apparent input resistance of transistor 17, through diode 18 and the base-to-emitter junction of transistor 17, causes an increase in voltage across diode 18. The voltage-current characteristics of diode 18 are chosen so the increase in voltage across this diode is opposite to the decrease of voltage across the base-to-emitter junction of transistor 17. The base-to-ground voltage of transistor 17 is always maintained at a positive value. The use of diode 18 therefore maintains the amplifying stage in a linear mode of operation throughout the operational range while maintaining a high degree of efficiency. Potentiometer 19 is used to establish the static operating collector current. Chokes 20 and 21 provide D.C. isolation. Capacitor 22 (1000 microfarads) is a radio frequency bypass capacitor. Capacitor 23 couples the driving source to point 16.

A practical circuit, using as element 17 a Motorola 2N2947 transistor operating at 30 megacycles with an output power of 8 watts, exhibited the following conditions: The regulator circuit degraded the efficiency less than 3% with static currents ranging from 100 milliamperes to 25 milliamperes. Compared to an amplifier stage operating with an R.F. choke between base and emitter (ground), the worst-case intermodulation products were reduced by 11 decibels, a decrease in amplitude from −14 decibels to −25 decibels at an 8 watt output level with 25 milliamperes of static current. As the static collector current of transistor 17 was increased to 100 milliamperes, the worst-case intermodulation products were reduced further to −39 decibels.

While thee has been shown and described what is at present believed to be the preferred embodiment of the invention, it will be understood by those skilled in the art that various modifications and changes may be made therein without departing from the scope of the invention as defined by the appended claims.

I claim:

1. The combination of:

a radio frequency power amplifier of the type including an NPN type power transistor having a first collector and a first base and a first emitter arranged in the common emitter configuration to provide an input base-emitter junction, a signal source coupled to the base of said power transistor, a biasing network connected across said junction and comprising the series combination of a choke connected to said base, a diode having a cathode connected to said choke and also an anode and a resistor provided with a variable top output, said diode being so poled that its anode provides a reference point and so that the voltage drop across it increases as increased signal drive causes a decrease in the voltage drop across said input junction, an energy source and constant voltage circuit means biased by said energy source for maintaining a predetermined forward bias potential at said reference point, said constant voltage circuit means comprising:

second and third transistors each having an emitter and a collector and a base, said resistor having a high potential terminal connected to the emitter of the third transistor and said variable tap output being connected to the base of said second transistor, the emitter of the second transistor being connected to ground and the collector of the second transistor being connected to the base of the third transistor, the emitter of the third transistor being connected to the anode of the diode at said reference point, load resistors between the collectors of the second and third transistors and said source of energy, a second choke between said source of energy and the collector of said power transistor, and a by-pass capacitor connected in series between ground and said first choke.

2. The combination of a transistor arranged in the grounded emitter configuration and having a collector and a base and a grounded emitter, a biasing network comprising the series combination of a choke and a diode and a resistor connected in shunt with the junction formed by said base and emitter, whereby a closed path is completed from ground, said emitter, said base, said choke, the cathode of the diode, the anode of the diode, said resistor and ground, said anode providing a point of reference potential, and a constant voltage source connected across said resistor to maintain said reference point at a constant potential which is substantially distributed between said diode and said junction.

References Cited

FOREIGN PATENTS 820,053 3/19/63 Great Britain.

ROY LAKE, *Primary Examiner.*

L. J. DAHL, *Assistant Examiner.*